US007821259B2

(12) United States Patent
Schanda et al.

(10) Patent No.: US 7,821,259 B2
(45) Date of Patent: Oct. 26, 2010

(54) DEVICE AND METHOD FOR EXAMINING MAGNETIC CHARACTERISTICS OF OBJECTS

(75) Inventors: Ulrich Schanda, Holzkirchen (DE); Horst Dötsch, Osnabrück (DE); Carsten Holthaus, Osnabrück (DE); Alexei Trifonov, Osnabrück (DE); Jürgen Schützmann, Pfaffenhofen (DE)

(73) Assignee: Giesecke & Devrient GmbH, Munich (DE)

( * ) Notice: Subject to any disclaimer, the term of this patent is extended or adjusted under 35 U.S.C. 154(b) by 821 days.

(21) Appl. No.: 11/597,559

(22) PCT Filed: May 25, 2005

(86) PCT No.: PCT/EP2005/005668

§ 371 (c)(1),
(2), (4) Date: Mar. 2, 2007

(87) PCT Pub. No.: WO2005/116942

PCT Pub. Date: Dec. 8, 2005

(65) Prior Publication Data

US 2007/0241749 A1 Oct. 18, 2007

(30) Foreign Application Priority Data

May 27, 2004 (DE) ....................... 10 2004 025 937

(51) Int. Cl.
*G01R 33/032* (2006.01)

(52) U.S. Cl. .................................... 324/244.1; 324/261

(58) Field of Classification Search ................. 324/244, 324/244.1, 260, 261; 250/559.01, 559.4; 428/689, 692.1
See application file for complete search history.

(56) References Cited

U.S. PATENT DOCUMENTS

| | | | | |
|---|---|---|---|---|
| 3,513,457 | A | 5/1970 | Nelson | |
| 3,665,431 | A | 5/1972 | Alstad et al. | |
| 4,563,646 | A | 1/1986 | Desormiere | |
| 5,227,938 | A | 7/1993 | Colineau et al. | |
| 5,493,222 | A * | 2/1996 | Shirai et al. | 324/244.1 |
| 5,568,336 | A | 10/1996 | Jolivet | |
| 5,689,391 | A | 11/1997 | Maurice | |
| 6,151,192 | A | 11/2000 | Maurice | |
| 6,232,763 | B1 * | 5/2001 | Itoh | 324/96 |
| 6,806,704 | B2 | 10/2004 | Schützmann | |
| 6,927,571 | B2 | 8/2005 | Schützmann | |

FOREIGN PATENT DOCUMENTS

| | | |
|---|---|---|
| DE | 40 21 359 | 1/1992 |
| DE | 40 25 171 | 2/1992 |
| DE | 197 18 122 | 11/1998 |
| DE | 101 03 378 | 6/2002 |
| DE | 101 03 379 | 7/2002 |
| FR | 2 656 723 | 7/1991 |
| WO | WO 02/052498 | 7/2002 |
| WO | WO 02/052512 | 7/2002 |

* cited by examiner

*Primary Examiner*—Bot L LeDynh
(74) *Attorney, Agent, or Firm*—Bacon & Thomas, PLLC

(57) ABSTRACT

The invention concerns a device and a method for examining magnetic properties of objects, in particular of sheet material such as for example bank notes. Therein the invention proceeds from a device and a method for examining magnetic properties of objects with a magneto-optical layer having magnetic domains, the optical properties of the magneto-optical layer being influenced by the magnetic properties of the object to be examined, at least one light source for the generation of light incident upon the magneto-optical layer, and at least one sensor for the reception of light which is transmitted and/or reflected by the magneto-optical layer, with a magnetic filed in the area of the magneto-optical layer which extends substantially parallel to the surface of the magneto-optical layer.

20 Claims, 2 Drawing Sheets

DEVICE AND METHOD FOR EXAMINING MAGNETIC CHARACTERISTICS OF OBJECTS

FIELD OF THE INVENTION

The invention relates to a device and a method for examining the magnetic properties of objects, in particular of sheet material such as for example bank notes. The device comprises a magneto-optical layer having magnetic domains, the optical properties of the magneto-optical layer being influenceable by the magnetic properties of the object to be examined, at least one light source for the generation of light incident upon the magneto-optical layer, and at least one sensor for receiving light which is transmitted and/or reflected by the magneto-optical layer.

BACKGROUND

To guarantee high forgery-proofness, bank notes are inter alia provided with magnetic properties. During automated bank note testing in bank note processing apparatus, bank notes are therefore also examined for their magnetic properties to distinguish counterfeits or suspected counterfeits from authentic bank notes.

Herein the examination of the magnetic properties of bank notes is usually effected using inductive measuring heads, Hall elements or magnetoresistive elements, such as field plates or thin permalloy layers.

In addition, it is known to examine the magnetic properties of bank notes using magneto-optical layers. A suitable device is for example known from the German laid-open publication DE 197 18 122 A1. Herein a magneto-optical reflector layer with a high magnetic Kerr effect is illuminated with polarized light and the reflected light is detected after passing through a polarization filter. If a bank note to be examined is brought close behind the reflector layer, the magnetic leakage flux of the magnetic areas of the bank note influences the optical behavior of the reflector layer, thereby changing the polarization direction of the detected light. From the measured change of polarization one can then infer the magnetic properties of the sheet material. Compared to the frequent use of inductive measuring heads, the use of magneto-optical layers has the advantage that they allow higher spatial resolution and the measurement of magnetic flux is independent of the speed of the bank note relative to the measuring system. In addition, the use of magneto-optical layers allows the use of an imaging method for the visualization of the magnetic patterns incorporated in the bank note.

The examination of the magnetic properties of bank notes by machine involves in particular the problem that very small magnetic flux densities must be detected to be able to guarantee a sufficiently precise and reliable verification of authenticity. This is because, firstly, the leakage flux caused by the individual magnetic areas of the bank notes is very small and, secondly, the typical distances between bank note and magneto-optical layer cannot be reduced at will due to the high transport speed required in bank note processing apparatus, as this would otherwise lead to elevated wear of the bank notes to be checked as well as individual sensor components and in addition result in an elevated risk of jams.

From WO 02/052498 A2 a device and a method for investigating the magnetic properties of objects are known, in which magneto-optical layers with regularly arranged magnetic domains are used. Therein light generated by a light source incident upon the magneto-optical layer is diffracted by the regularly arranged magnetic domains. The light which is diffracted and transmitted or reflected by the layer is received by a sensor. If an object, in particular a sheet, with magnetic areas is disposed close to the magneto-optical layer, the magnetic areas of the sheet influence the optical properties of the magnetic layer, wherein the distances and/or widths of the regularly arranged magnetic domains vary in accordance with the direction and intensity of the magnetic field of the sheet acting on the magneto-optical layer. The detected intensity and/or position of the diffracted light changes correspondingly depending on the magnetic properties of the sheet, so that the magnetic properties of the sheet can be inferred therefrom.

The known device and the method for examining magnetic properties of objects by means of magneto-optical layers with regularly arranged magnetic domains have the advantage that the used magneto-optical layers with domains have a high sensitivity, for which reason they are suitable for the detection of very small changes in the density of the magnetic flux. However, the spatial resolution is limited by the size of the magnetic domains.

From WO 02/052512 A2 a device and a method for examining magnetic properties of objects are known, in which a magneto-optical layer is used which is arranged as a so-called in-plane layer. Such in-plane layers do not have any magnetic domains, or rather one single magnetic domain lies in the layer itself and extends parallel thereto. Such magneto-optical layers have the advantage that they allow practically any spatial resolution. However, the sensitivity of the in-plane layers for changes of the density of the magnetic flux is substantially lower than that of the magneto-optical layers with magnetic domains. Therefore in the known method and the device the change, i.e. the rotation, of the polarization direction of the light coupled into the magneto-optical layer is increased by increasing the optical path length of the light passing through the magneto-optical layer. For this purpose the light source and the magneto-optical layer are so disposed that the direction of propagation of the light coupled into the layer extends substantially parallel to a base surface of the magneto-optical layer.

However, the known device and the method for examining magnetic properties of objects by means of magneto-optical in-plane layers have the shortcoming that the production of such in-plane layers is complex and therefore expensive.

Further problems arise if in addition to objects to be examined with strictly predetermined magnetic properties also such objects are examined which have magnetic properties that are undetermined, so that they defy examination, or rather are not accessible to examination without difficulty.

SUMMARY

It is the object of the present invention to provide a device and a method which allow a more precise and more reliable examination of magnetic properties of objects, in particular of sheet material.

In addition, the device and the method are to allow examination also for the case that the magnetic properties are not accessible to examination without difficulty.

Therein the invention proceeds from a device and a method for examining magnetic properties of objects, in particular of sheet material such as for example bank notes, with a magneto-optical layer having magnetic domains, the optical properties of the magneto-optical layer being influenceable by the magnetic properties of the object to be examined, at least one light source for the generation of light incident upon the magneto-optical layer, and at least one sensor for receiving light which is transmitted and/or reflected by the magneto-optical layer, with a magnetic field in the area of the magneto-optical layer which extends substantially parallel to the surface of the magneto-optical layer.

The device according to the invention has the advantage that magneto-optical layers with magnetic domains, which can be produced at less expense, can be used, whose spatial resolution capacity is improved by the magnetic field extending substantially parallel to the surface of the magneto-optical layer. In addition, by means of the magnetic field also magnetic properties can be examined which are not accessible without difficulty.

In a favorable embodiment the field intensity of the magnetic field parallel to the magneto-optical layer is dimensioned in such a way that the magnetic domains are rendered essentially smaller.

Thereby the high sensitivity of the magneto-optical layer with magnetic domains is essentially safeguarded, whereas an essentially higher spatial resolution can be achieved by the substantial diminution of the domains.

In a different favorable embodiment the field intensity of the magnetic field parallel to the magneto-optical layer is dimensioned in such a way that the magnetic domains just barely collapse.

This makes a measurement signal with especially great dynamics available, while the spatial resolution is very high.

In a further favorable embodiment the field intensity of the magnetic field parallel to the magneto-optical layer is dimensioned in such a way that no magnetic domains exist any longer.

This makes a very high spatial resolution available, while the sensitivity is sufficient.

DESCRIPTION OF THE DRAWINGS

Further advantages of the present invention will be explained and described in more detail hereinafter with reference to the enclosed figures.

The figures are described as follows.

DETAILED DESRIPTION OF VARIOUS EMBODIMENTS

Figure 1:
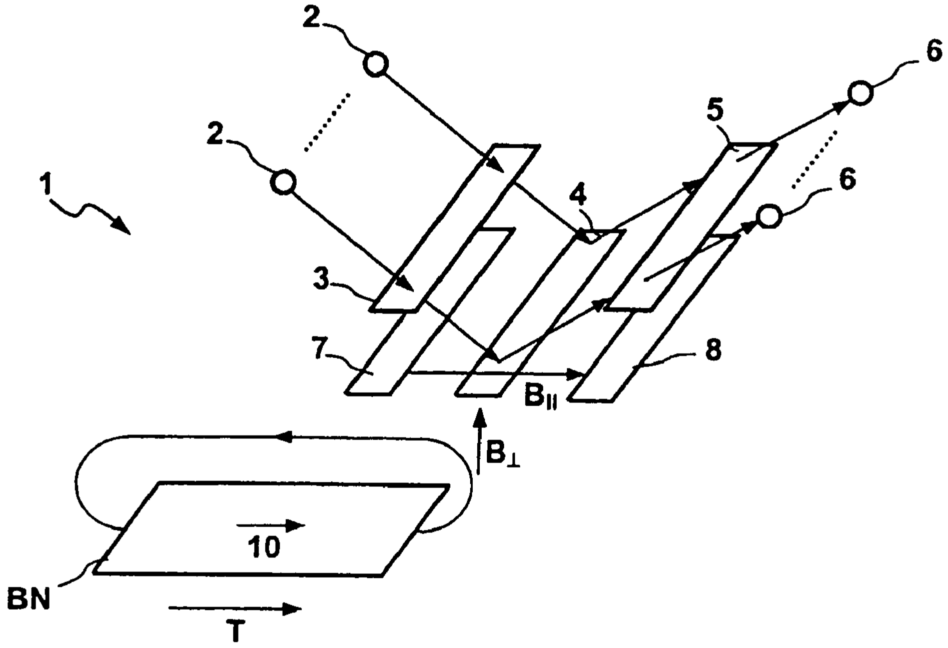
FIG. 1 construction in principle of a device for examining magnetic properties of objects, FIG. 2 construction in principle of a magneto-optical detector used in the device according to FIG. 1, FIG. 3 gradient in principle of sensitivity of the detector of FIG. 2, depending on a magnetic field extending parallel to the surface of the detector, and FIG. 4 magnet devices for the generation of a magnetic field parallel to the surface of the detector according to FIG. 2.

FIG. 1 shows a construction in principle of a device 1 for examining magnetic properties of objects.

Objects to be examined are to be understood to represent particularly sheet material, such as bank notes which have magnetic elements. Such elements can be printing inks with magnetic particles, magnetic security threads, etc. Therein it can be intended that the objects have magnetic properties which can be examined without difficulty, i.e. the objects themselves generate a certain magnetic field. For this purpose the objects can for example show at least traces or certain percentages of magnetically hard substances, which are e.g. distributed in and/or arranged on the object according to a certain pattern. Since the magnetically hard substances have a certain residual magnetism, subsequent to a one-time orientation they generate a magnetic field which is analyzable for the purpose of examination. It is equally possible that the objects have magnetic characteristics which cannot be examined without difficulty, i.e. the objects do not generate a magnetic field themselves. For this purpose the objects can for example show at least traces or certain percentages of magnetically soft substances, which are e.g. distributed in and/or arranged on the object according to a certain pattern. Since the magnetically soft substances do not have any residual magnetism, they do not generate a magnetic field themselves which is analyzable for the purpose of examination. To generate a magnetic field which is analyzable for the purpose of examination, it is necessary to subject such objects to a magnetic field for the duration of the examination, so that the magnetically soft substances contained on and/or in the object orient themselves so that they can be examined.

The device 1 has a detector 4 which is formed by a magneto-optical layer with magnetic domains. A magnet device 7, 8, which is for example formed by at least one permanent magnet, generates a magnetic field $B_{||}$, which in the area of the detector 4 extends parallel to the surface of the detector 4 or of the magneto-optical layer. The light of at least one light source 2 is polarized by means of a polarizer 3. The polarized light illuminates the detector 4, is reflected and/or transmitted by the latter, passes an analyzer 5 and is received by at least one sensor 6.

An object BN to be examined, e.g. a bank note, is transported by a not shown transport system along a direction T, essentially along the long edges of the BN, past the device 1. By the magnetic field $B_{||}$ of the magnet device 7, 8 the magnetic material provided in and/or on the bank note BN is oriented in such a way that it generates a further magnetic field 10. A component $B_{\perp}$ of the magnetic field 10 extending perpendicular to the detector 4 incites a change, in particular rotation, of the polarization direction of the light in the magneto-optical layer of the detector 4. This change of the polarization direction is analyzed via a change of the intensity of the light passing the analyzer 5 and received by the sensors 6 for the examination of the magnetic properties of the object BN or of the bank note.

Figure 2:
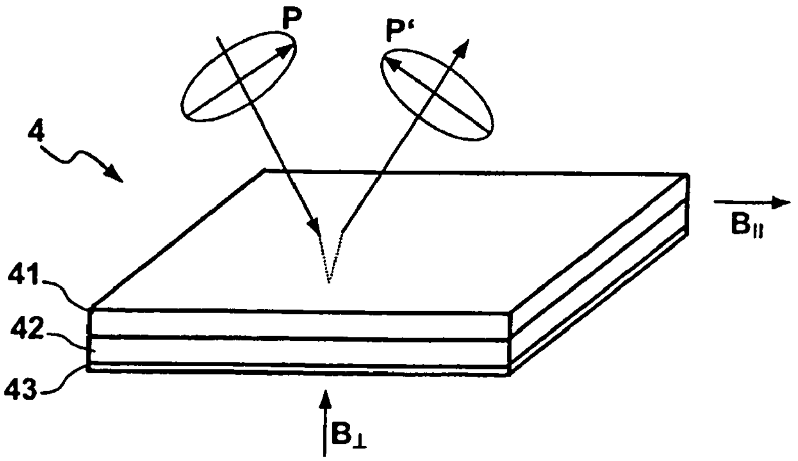

FIG. 2 shows the construction of the detector 4 in detail. The detector consists of a substrate 41 to which the magneto-optical layer having the magnetic domains is applied. To the magneto-optical layer 42 a photoresist layer 43 is applied by which the light generated by the light source 2 is diffused or reflected. The substrate 41 can for example be a monocrystalline wafer of gadolinium gallium garnet. The applied magneto-optical layer 42 consists for example of yttrium and/or lutetium iron garnet. Therein, yttrium and/or lutetium can be partially or entirely substituted by bismuth and/or cerium to increase the Faraday rotation. Furthermore, to adjust the magnetic anisotropies, yttrium and/or lutetium can be substituted by rare earths, such as e.g. praseodymium or neodymium. To adjust the magnetization iron can be substituted by gallium and/or aluminum.

The photoresist layer consists for example of aluminum. The light generated by the light source 2, which is polarized by the polarizer 3 in a direction P, through the photoresist substrate 41 penetrates the magneto-optical layer 42 in which the polarization direction P is rotated through the influence of the perpendicular component $B_{\perp}$ of the magnetic field 10, is reflected by the photoresist layer 43, is rotated once more and has a changed polarization direction P'. The change of the polarization direction of the light is, as described above, received by the sensor(s) 6 and analyzed by a not shown analyzing device, e.g. A/D converters and a microcomputer.

In this way the transport T of the bank note BN past the device 1 allows the generation of an image of the magnetic properties of the bank note BN.

Figure 3:
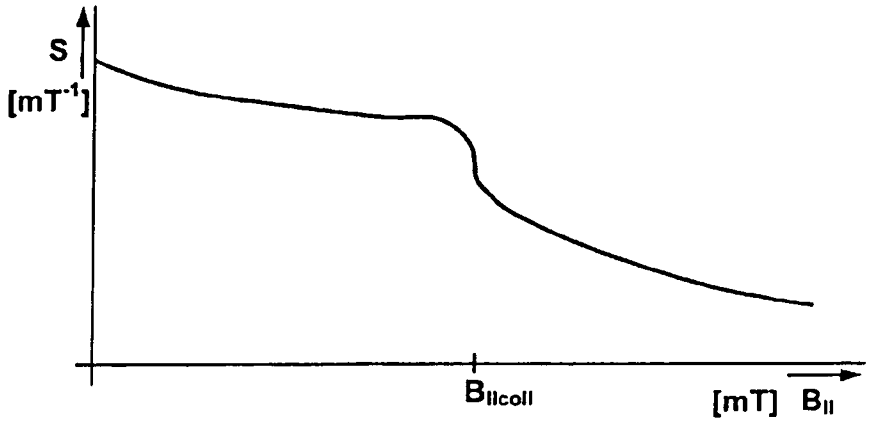

FIG. 3 shows a gradient in principle of the sensitivity of the magneto-optical layer of the detector 4 depending on the magnetic field $B_{||}$ extending parallel to the surface of the detector 4.

Preferably the field intensity of the magnetic field $B_{||}$ of the magnet device 7, 8 is chosen in such a way that it lies in the range of a field intensity $B_{||coll}$ in which the magnetic domains of the magneto-optical layer 42 collapse, i.e. the domains extending in the magneto-optical layer 42 disappear, or merge into one single domain lying inside the magneto-optical layer 42 and extending parallel thereto. For the above-mentioned materials of the magneto-optical layer the field intensity $B_{||coll}$ can lie in range of 40-100 mT. However, also lower field intensities than 40 mT, even field intensities below 1 mT, are conceivable.

If the field intensity of the magnetic field $B_{||}$ is chosen in such a way that it is lower than the range of the field intensity $B_{||coll}$ in which the magnetic domains collapse, a high sensitivity of the magneto-optical layer 42 for the magnetic field $B_{\perp}$ to be examined is available. However, since the field intensity of the magnetic field $B_{||}$ is already in the range before the collapse of the magnetic domains, the magnetic domains have an essentially smaller structure than without the magnetic field $B_{||}$, so that the spatial resolution is essentially improved.

In this case, such as described e.g. in the above-mentioned WO 02/052498 A2, changes of the position of a first and/or further diffraction orders can be measured which are generated by the magnetic domains of the magneto-optical layer 42, wherein the lattice-forming magnetic domains are changed in regard of their lattice period by the magnetic property of the object BN to be examined, i.e. by the magnetic field $B_{\perp}$. For measuring a position-sensitive detector for light can be used favorably, for example a quadrant detector.

If the field intensity of the magnetic field $B_{||}$ is chosen in such a way that it corresponds to the field intensity $B_{||coll}$ in which the magnetic domains collapse, a great dynamic range is available for the magnetic field $B_{\perp}$ to be examined. Since the magnetic intensity of the magnetic field $B_{||}$ already induces the collapse of the magnetic domains, the possible spatial resolution is essentially improved.

If the field intensity of the magnetic field $B_{||}$ is chosen in such a way that it is higher than the range of the field intensity according to $B_{||coll}$ in which the magnetic domains collapse, the magneto-optical layer 42 with domains is rendered an in-plane layer of a high sensitivity for the magnetic field $B_{\perp}$ to be examined, since the sensitivity only decreases slightly in comparison. Since due to the field intensity of the magnetic field $B_{||}$ the magnetic domains have collapsed, i.e. disappeared, and only one in-plane domain remains, in principle an arbitrarily high spatial resolution is possible.

Figure 4:
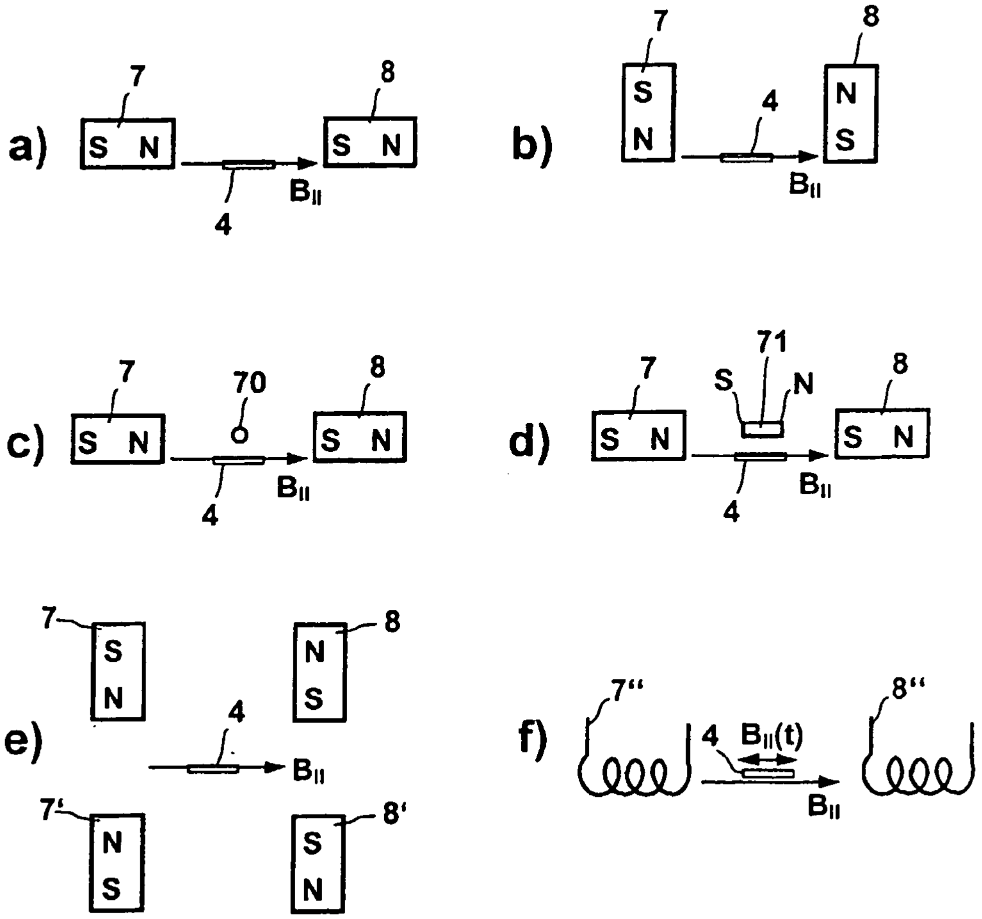

FIG. 4 shows various embodiments of magnet devices 7, 8 for the generation of the magnetic field $B_{||}$ parallel to the surface of the detector 4.

The FIGS. 4*a* and 4*b* each show assemblies of the magnet device 7, 8 of two permanent magnets 7 and 8, which are disposed such that in the area of the detector 4 a preferably homogenous magnetic field $B_{||}$ is generated which extends parallel to the surface of the detector 4.

The FIGS. 4*c* and 4*d* also each show assemblies of the magnet device 7, 8 of two permanent magnets 7 and 8, with measures 70, 71 for the homogenization of the magnetic field $B_{||}$. According to FIG. 4*c* it is intended to provide a current-carrying conductor 70 extending parallel to the detector 4, whose magnetic field compensates any variances of the magnetic field generated by the permanent magnets 7, 8 from the desired magnetic field $B_{||}$ extending parallel to the detector 4. For this purpose it is intended in the embodiment according to FIG. 4*d* to provide a further permanent magnet 71 which extends parallel to the detector 4 instead of a current-carrying conductor.

As a further measure of homogenization of the magnetic field it is reasonable to short-circuit the free poles of the permanent magnets by magnetically soft yokes.

FIG. 4*e* shows an embodiment of the magnet device consisting of four permanent magnets 7, 7' and 8, 8'. This assembly corresponds to a Helmholtz assembly and generates a very homogenous magnetic field $B_{||}$, with a very good parallel extension to the surface of the detector 4.

It is obvious that also other assemblies of magnets can be used for the magnet device, as long as they generate the desired homogenous magnetic field $B_{||}$ extending parallel to the surface of the detector 4 and flowing through the magneto-optical layer 42. Instead of permanent magnets also electromagnets can be used.

If electromagnets are used, it is additionally possible to generate a time-variable magnetic field $B_{||(t)}$. The use of a time-variable magnetic field $B_{||(t)}$ allows the use of the lock-in technique in the analysis of the measurement signals, in which the analysis of the measurement signals takes place depending on the time-variation of the magnetic field $B_{||(t)}$. Thereby the signal-to-noise ratio of the measurement of the magnetic field $B_{\perp}$ can be essentially improved. Suitable frequencies for the time-variable magnetic field $B_{||(t)}$ lie in the range above 10 kHz. The described time-variable magnetic field $B_{||(t)}$ can be generated by means of electromagnets and can have a field intensity which lies in the range of the above described field intensity $B_{||coll}$. However, the necessary field intensity in the range of $B_{||coll}$ can also be generated by a time-invariable portion $B_{||}$ and a time-variable portion $B_{||(t)}$. Therein it can in particular be intended that the ratio of portions complies with: $B_{||}>B_{||(t)}$. As a further alternative, it is possible to generate the time-invariable portion $B_{||}$ by means of permanent electromagnets.

FIG. 4*f* shows a possible assembly of electromagnets 7" and 8", for the generation of a magnetic field $B_{||}$ which, as described above, can contain at least one time-variable portion $B_{||(t)}$. The electromagnets 7", 8" can also comprise iron cores. The electromagnets 7", 8" can also be used in addition to the permanent magnets 7, 7', 8, 8' shown in the FIGS. 4*a* to 4*e*.

As described above, the fluctuations of the intensity of the light resulting from the rotation of the polarization direction are analyzed by the sensor 6 to generate an image of the magnetic properties of the object BN. For this purpose both the detector 4 and the sensor 6 have a linear structure, wherein the length of detector 4 and sensor 6 corresponds to at least one dimension of the object BN, so that the latter can be examined in its entirety. Detector 4 and sensor 6 can each consist of individual elements which are arranged linearly, but they can also each consist of one single element, e.g. the sensor 6 can be formed by one CCD line. The same is valid for the light source 2, polarizer 3, analyzer 5 and magnet device 7, 8, i.e. also these can consist of individual elements which are arranged linearly, or of individual elements of a corresponding size.

Instead of the described linear arrangement of the components of the device 1 also a punctiform arrangement can be intended which allows for the examination of one or several defined spots of the object BN. Likewise a two-dimensional arrangement of the components of the device 1 can be intended, so that the object BN can be examined in its entirety or in sections thereof.

Departing from the above description of the device 1, in which the object BN to be examined is transported past the device 1 for examination purposes, an examination can also be carried out without a relative movement between the device 1 and the object BN.

The selection of the wavelength of the light generated by the light source 2 is of special importance. For light of a great wavelength experiences only a minor rotation of the polarization direction in the magneto-optical layer 42, whereas light of a small wavelength is absorbed by the magneto-optical layer to a great extent. For this reason a light source 2 with a wavelength in a range of 550-650 nm, in particular approximately 590 nm, has proven particularly suitable.

Instead of the described construction of the detector 4, in which the light reflected by the detector 4 is received and analyzed by the sensors 6, in a different construction also light transmitted by the detector 4 can be received by the sensors 6.

The invention claimed is:

1. Device for the examination of magnetic properties of objects having a magneto-optical layer having magnetic domains, wherein the optical properties of the magneto-optical layer are influenceable by the magnetic properties of the object to be examined, comprising:

at least one light source arranged to generate light incident upon the magneto-optical layer;

a polarizer arranged to polarize the light generated by the light source; and at least one sensor arranged to receive either of or both light transmitted and light reflected by the magneto-optical layer, wherein the device is provided with a magnet device generating a first magnetic field which is substantially parallel to the surface of the magneto-optical layer and which flows through the magneto-optical layer, wherein the magnetic properties of the object to be examined generates a second magnetic field, and wherein the second magnetic field is perpendicular to the surface of the magneto-optical layer and rotates the polarization direction of the light in the magneto-optical layer.

2. Device according to claim 1, wherein the first magnetic field generated by the magnet device has a field intensity which is marginally smaller than a field intensity in which the magnetic domains of the magneto-optical layer collapse.

3. Device according to claim 1, wherein the first magnetic field generated by the magnet device has a field intensity which approximately corresponds to a field intensity in which the magnetic domains of the magneto-optical layer collapse.

4. Device according to claim 1, wherein the first magnetic field generated by the magnet device has a field intensity which is marginally greater than a field intensity in which the magnetic domains of the magneto-optical layer collapse.

5. Device according to claim 2, wherein the field intensity in which the magnetic domains of the magneto-optical layer collapse is below 100 mT.

6. Device according to claim 1, wherein a transport system transports the object past the device for the purpose of examination.

7. Device according to claim 1, wherein the size of the device corresponds to at least one dimension of the object.

8. Device according to claim 1, wherein the magneto-optical layer comprises magnetic iron garnet, wherein for the adjustment of the magnetic and magneto-optical properties one or more other elements selected from the group consisting of bismuth, cerium, rare earths, gallium and aluminum are incorporated.

9. Device according to claim 1, wherein the magnet device comprises either of or both permanent magnets and electromagnets.

10. Device according to claim 1, wherein the magnet device is arranged to generate either of or both a time-variable magnetic field and a time-invariable magnetic field.

11. Device according to claim 1, wherein the object comprises either of or both magnetically hard and soft materials.

12. Method for examining magnetic properties of objects having a magneto-optical layer having magnetic domains, wherein the optical properties of the magneto-optical layer are influenceable by the magnetic properties of the object to be examined, comprising: illuminating the magneto-optical layer with light, and analyzing either of or both the light transmitted and light reflected by the magneto-optical layer, wherein a magnetic field is generated which is substantially parallel to the surface of the magneto-optical layer and which flows through the magneto-optical layer, wherein the magnetic field has a field intensity which is marginally smaller than a field intensity in which the magnetic domains of the magneto-optical layer collapse.

13. Method for examining magnetic properties of objects having a magneto-optical layer having magnetic domains, wherein the optical properties of the magneto-optical layer are influenceable by the magnetic properties of the object to be examined, comprising: illuminating the magneto-optical layer with light, polarizing the light, and analyzing either of or both the light transmitted and light reflected by the magneto-optical layer, wherein a first magnetic field is generated which is substantially parallel to the surface of the magneto-optical layer and which flows through the magneto-optical layer, wherein the first magnetic field has a field intensity which approximately corresponds to a field intensity in which the magnetic domains of the magneto-optical layer collapse, wherein the magnetic properties of the object to be examined generates a second magnetic field, and wherein the second magnetic field is perpendicular to the surface of the magneto-optical layer and rotates the polarization direction of the light in the magneto-optical layer.

14. Method for examining magnetic properties of objects having a magneto-optical layer having magnetic domains, wherein the optical properties of the magneto-optical layer are influenceable by the magnetic properties of the object to be examined, comprising: illuminating the magneto-optical layer with light, and analyzing either of or both the light transmitted and light reflected by the magneto-optical layer, wherein a magnetic field is generated which is substantially parallel to the surface of the magneto-optical layer and which flows through the magneto-optical layer, wherein the magnetic field has a field intensity which is marginally greater than a field intensity in which the magnetic domains of the magneto-optical layer collapse.

15. Method according to claim 12, wherein the magnetic field comprises either of or both a time-variable portion and a time-invariable portion.

16. Method according to claim 12, wherein the changes of the position of either of or both first and further diffraction orders are measured which are generated by the magnetic domains of the magneto-optical layer, and wherein lattice-forming magnetic domains are altered in regard to their lattice period by the magnetic property of the object to be examined.

17. Method according to claim 13, wherein the magnetic field comprises either of or both a time-variable portion and a time-invariable portion.

18. Method according to claim 13, wherein the changes of the position of either of or both first and further diffraction orders are measured which are generated by the magnetic domains of the magneto-optical layer, and wherein lattice-forming magnetic domains are altered in regard to their lattice period by the magnetic property of the object to be examined.

19. Method according to claim 14, wherein the magnetic field comprises either of or both a time-variable portion and a time-invariable portion.

20. Method according to claim 14, wherein the changes of the position of either of or both first and further diffraction orders are measured which are generated by the magnetic domains of the magneto-optical layer, and wherein lattice-forming magnetic domains are altered in regard to their lattice period by the magnetic property of the object to be examined.

* * * * *